United States Patent [19]
Johnston et al.

[11] Patent Number: 6,053,240
[45] Date of Patent: Apr. 25, 2000

[54] HEAT SINK

[75] Inventors: Craig N. Johnston, Bedford, N.H.;
Daniel J. Haas, Oak Creek, Wis.

[73] Assignee: Aavid Thermal Technologies, Inc., Concord, N.H.

[21] Appl. No.: 09/242,162

[22] PCT Filed: Aug. 9, 1996

[86] PCT No.: PCT/US96/13069

§ 371 Date: Feb. 9, 1999

§ 102(e) Date: Feb. 9, 1999

[87] PCT Pub. No.: WO98/07304

PCT Pub. Date: Feb. 19, 1998

[51] Int. Cl.[7] .................................................. H05K 7/20
[52] U.S. Cl. .................... 165/80.3; 165/185; 361/704; 257/722
[58] Field of Search ...................... 165/80.3, 185; 361/704, 710; 257/722; 174/16.3

[56] References Cited

U.S. PATENT DOCUMENTS

| | | | |
|---|---|---|---|
| D. 361,317 | 8/1995 | Harmon et al. | D13/179 |
| 3,213,324 | 10/1965 | McAdam | 165/80.3 |
| 4,552,206 | 11/1985 | Johnson et al. | 165/80.3 |
| 5,311,928 | 5/1994 | Marton | 165/80.3 |
| 5,365,399 | 11/1994 | Kent et al. | 361/704 |

*Primary Examiner*—Allen Flanigan
*Attorney, Agent, or Firm*—Cohen, Pontani, Lieberman & Pavane

[57] ABSTRACT

A heat sink (60) comprising thermally conductive legs (72, 74) for coupling to a heat pad (64), a plurality of heat-convecting fins (86) that are thermally coupled to the legs, and a surface (80) cantilevered by support structure (82) coupled between the legs (72, 74). One or more heat-convecting fins (88, 90) may extend directly from the support structure (82). A method for making the heat sink is also disclosed.

4 Claims, 4 Drawing Sheets

HEAT SINK

BACKGROUND OF THE INVENTION

This invention relates to heat sinks.

Various heat sink designs have been proposed. McGaha (U.S. Pat. No. 5,311,395) discloses a heat sink that includes two side members, a connecting bridge, a foot on each side member for soldering to a mounting pad, a locating pin extending from the foot of each side member, and heat-dissipating fingers on each side member. Harmon (U.S. Pat. No. Des. 361,317) shows a heat sink design formed from two side members joined by a center region, and having a plurality of heat-dissipating fingers that extend from the center region along edges that are orthogonal to the edges to which the side members are coupled.

SUMMARY OF THE INVENTION

In one aspect, the invention features a heat sink comprising thermally conductive legs for coupling to a heat pad, a plurality of heat-convecting fins that are thermally coupled to the legs, and a surface cantilevered by support structure coupled between the legs.

In another aspect, the invention features a heat sink comprising thermally conductive legs for coupling to a heat pad, support structure coupled between the legs, a plurality of heat-convecting fins that extend directly from each of the legs, and one or more heat-convecting fins that extend directly from the support structure to provide a thermal path to ambient atmosphere.

Embodiments may include one or more of the following features. The legs, the surface, and the fins are preferably formed from the same piece of thermally conductive material into a unitary structure. The support structure preferably defines an aperture through which one or more leads of a heat generating component may extend. The surface is preferably coupled to the legs in a manner defining one or more vents between the surface and the legs to provide air flow access from above the heat sink to a heat generating component when the heat sink is used therewith. The legs and the cantilevered surface preferably define sufficient space to receive a heat-generating component without direct contact.

In another aspect, the invention features a surface mountable heat sink for convecting heat from a heat-generating component, the heat-generating component being thermally coupled to a thermally conductive heat pad, the heat sink comprising: a pair of thermally conductive legs that respectively couple to the heat pad and respectively extend away from the heat pad when the heat sink is coupled thereto; a pick-and-place surface coupled between the pair of legs, the pair of legs and the pick-and-place surface defining sufficient space to receive the heat-generating component so that the heat sink does not directly contact the heat-generating component when the heat sink is coupled to the heat pad; a pair of feet with each of the feet coupled to a respective one of the legs and oriented at an angle with respect thereto for coupling the heat sink to the thermally conductive pad; and a plurality of heat-convecting fins that are each thermally coupled to the legs for providing a thermal path from the legs to ambient atmosphere, wherein the legs are substantially parallel and each of the fins is oriented at an acute angle with respect to the legs.

In another aspect, the invention features a method for making a heat sink comprising the steps of: providing a sheet of thermally conductive material; bending the sheet along two parallel lines to form first, second, and third sides of the heat sink with the second side being adjacent to both the first and third sides; forming a plurality of fins from the first and third sides of the heat sink; and bending a portion of the second side at an angle with respect to the second side to form a cantilevered surface.

Embodiments may include one or more of the following features. One or more fins are preferably formed from the second side of the heat sink. Portions of the first and third sides are preferably bent to form feet for coupling to the thermally conductive pad to which a heat generating component is coupled.

Aspects of the invention concern surface mountable heat sinks for convecting heat from a heat-generating component that is thermally coupled to a thermally conductive heat pad.

Among the advantages of the invention are the following. Coupling the legs of the heat sink together with a third vertically extending side increases the effective area available for heat flow in a simple and easily manufactured structure. The cantilevered pick-and-place surface allows the heat sink to be manipulated by automated SMT equipment. Because the invention may be soldered directly to the heat pad, the same surface mount technology (SMT) used to mount electronic components on a circuit board may be used to mount the invention. The extra steps used to mount standard clip attach or epoxy attach heat sinks are not needed for mounting the invention. Thus, relative to such heat sink mounting techniques, the invention saves process time, set-up time, material costs, and labor costs. Because invention is surface mountable, it may be advantageously used where geometric tolerances of a heat generating component hinder or inhibit direct attachment of the heat sink to the component. The invention is particularly advantageous when used with heat generating components that have a shorter thermal path into the heat pad on the circuit board.

Other features and advantages will become apparent from the following description and from the claims.

DESCRIPTION OF THE PREFERRED EMBODIMENTS

Figure 1:
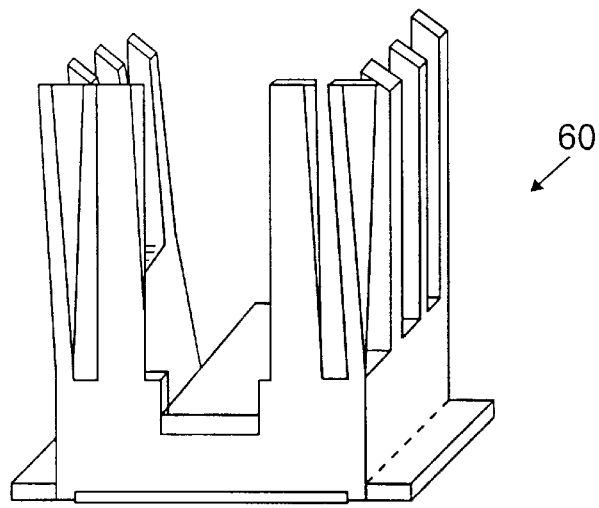
FIG. 1 is a diagrammatic exploded view of a surface mountable heat sink, a heat generating component, a thermally conductive heat pad, and a circuit board.
Figure 1C:
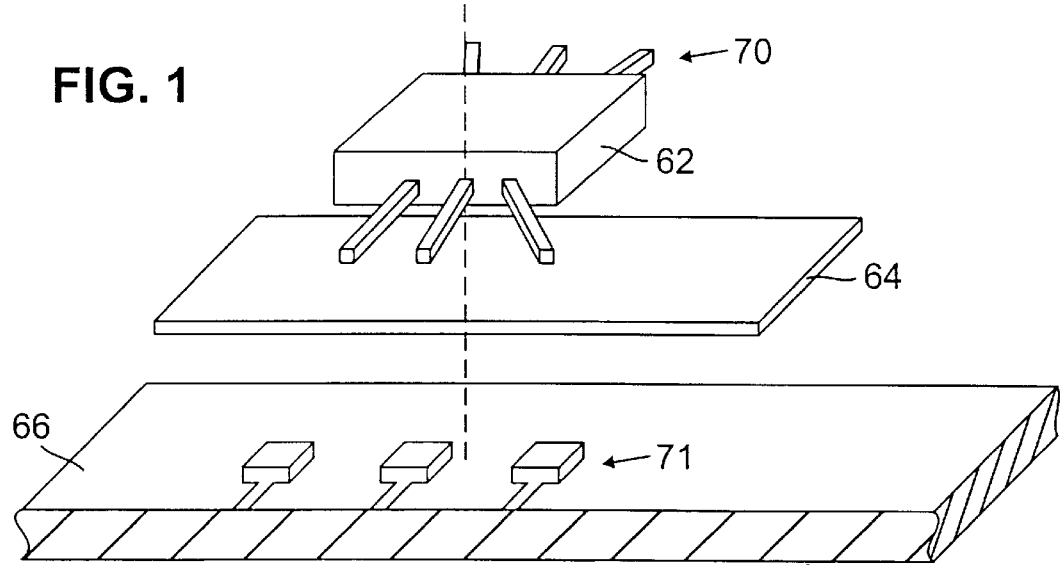
FIG. 1C is a diagrammatic top view of the surface mountable heat sink of FIG. 1.
Figure 1C:
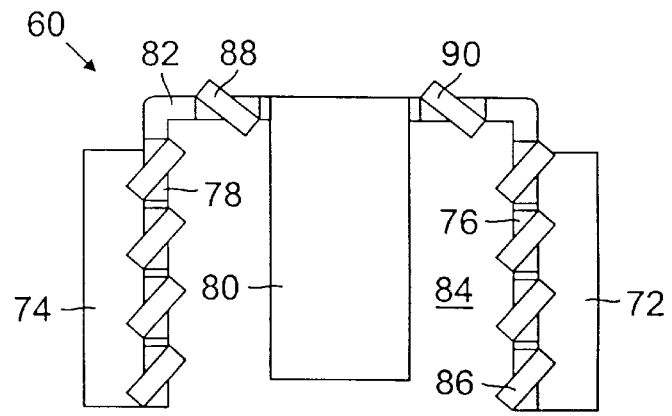
Figure 1A:
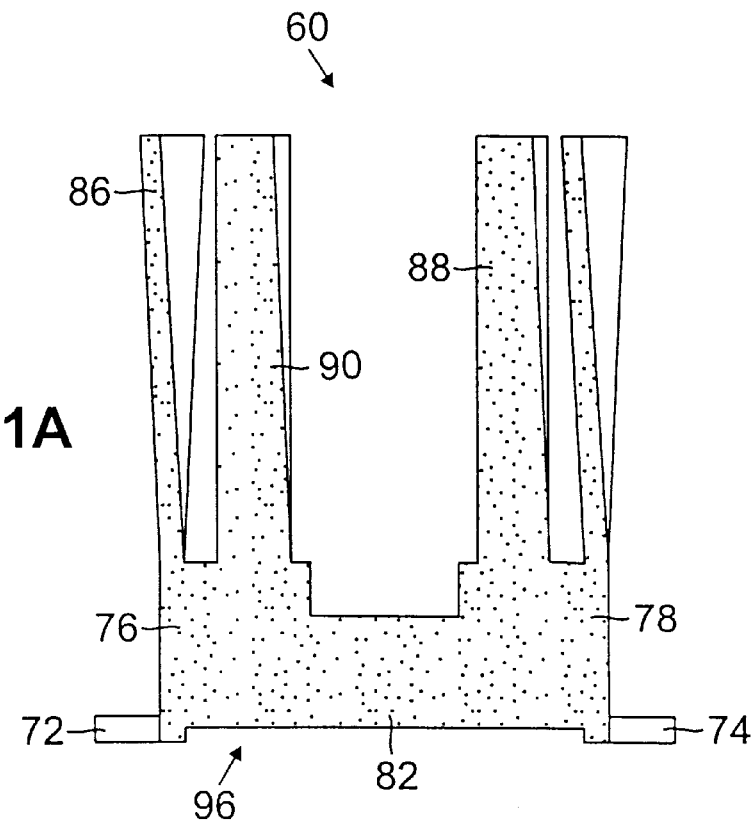
FIG. 1A is a diagrammatic side view of the surface mountable heat sink of FIG. 1.
Figure 1B:
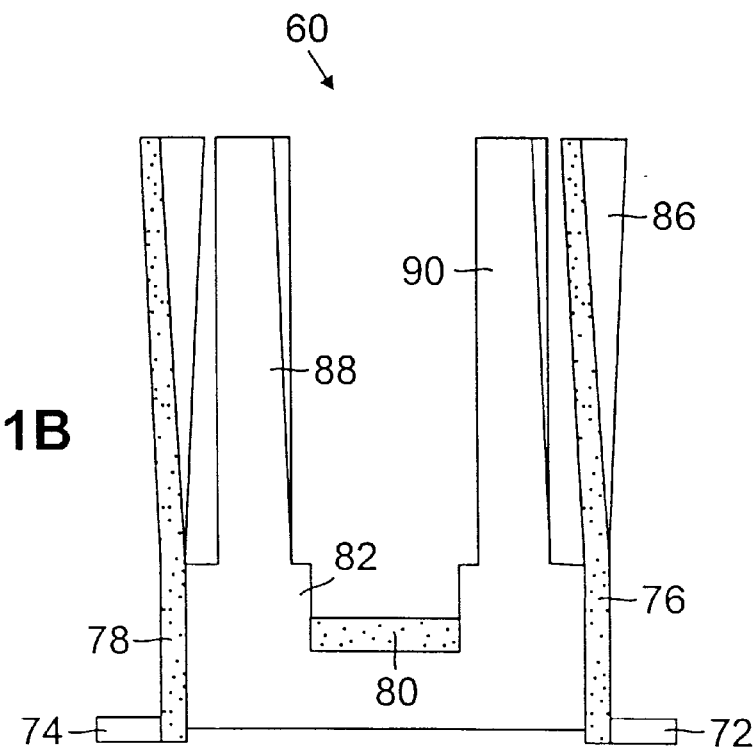
FIG. 1B is a diagrammatic side view of the surface mountable heat sink of FIG. 1 from the opposite perspective as that shown in FIG. 1A.

Referring to FIG. 1, a surface mountable heat sink 60 fits over a heat generating component 62, both of which are mounted onto a thermally conductive heat pad 64 on a circuit board 66. Heat sink 60 defines sufficient space to receive component 62 so that the heat sink does not directly contact the component. Component 62 has several leads 70 that extend beyond the ends of heat sink 60 and couple to respective circuit pads 71 on circuit board 66.

Referring to FIGS. 1A–2C, heat sink 60 includes a pair of feet 72, 74 that respectively couple to heat pad 64. Feet 72, 74 are coupled to a pair of legs 76, 78, respectively, which extend away from the heat pad when the heat sink is soldered or bonded by epoxy to the heat pad. Heat sink 60 also includes a pick-and-place surface 80 that is disposed between and coupled to each of the legs by a third side 82 of the heat sink. As mentioned above, the two legs and the pick-and-place surface define sufficient space 84 so that the heat sink does not directly contact the heat generating component.

A plurality of heat-convecting fins 86 extend from legs 76, 78 and a pair of fins 88, 90 extend from third side 82. The fins provide a thermal path from the legs to ambient atmosphere. The fins are twisted at an acute angle with respect to the legs to increase the effective heat-convecting surface area of the fins and to improve the interaction of the fins with surrounding forced air flow.

Referring back to FIG. 1, heat sink 60 is formed into a unitary structure from a single piece of thermally conductive material. The sheet is bent along two parallel lines 92, 94 to form legs 76, 78 and third side 82. The top portions of the legs and the third side are cut and each cut portion is twisted to form fins 86, 88, and 90. The center top portion of third side 82 is bent at an angle of 90° with respect to the third side to form cantilevered pick-and-place surface 80. The bottom portions of legs 76, 78 are respectively bent at an angle of 90° to form feet 72, 74. The bottom portion of third side 82 is cut out to form an aperture 96 (FIG. 1A) through which one or more leads from the heat generating component may extend.

In a presently preferred embodiment, designed for SOIC8 components, the feet are 0.05 inch wide and 0.23 inch long. The distance from the outer edge of one foot to the outer edge of the other foot is 0.444 inch. The pick-and-place surface is 0.12 inch wide and 0.25 inch long. The legs are 0.276 inch long and 0.12 inch high from the bottom of the feet to the base of the fins. The distance from the outer edge of one leg to the outer edge of the other leg is 0.344 inch. Aperture 96 (FIG. 1A) is 0.304 inch wide and 0.01 inch high. The fins extend 0.36 inch from the top of the legs. The copper stock is 0.02 inch thick.

Figure 2:
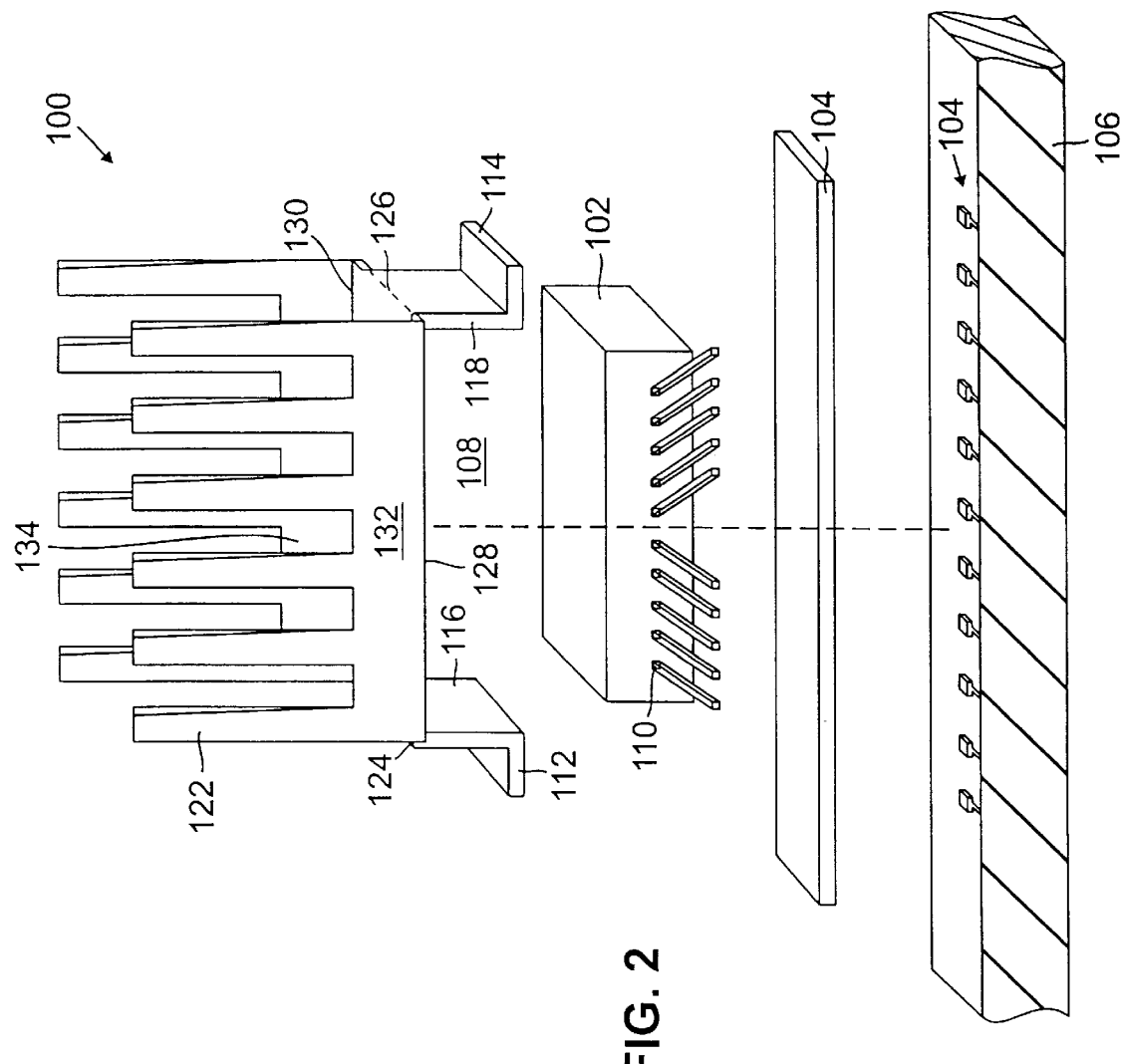
FIG. 2 is a diagrammatic exploded side view of a surface mountable heat sink, a heat generating component, a thermally conductive heat pad, and a circuit board.

Referring to FIG. 2, in another embodiment, a surface mountable heat sink 100 fits over a heat generating component 102, both of which are mounted onto a thermally conductive heat pad 104 on a circuit board 106. Heat sink 100 defines sufficient space 108 to receive component 102 so that the heat sink does not directly contact the component. Component 102 has several leads 110 that extend beyond the ends of heat sink 100 and couple to respective circuit pads Ill on circuit board 106.

Figure 2A:
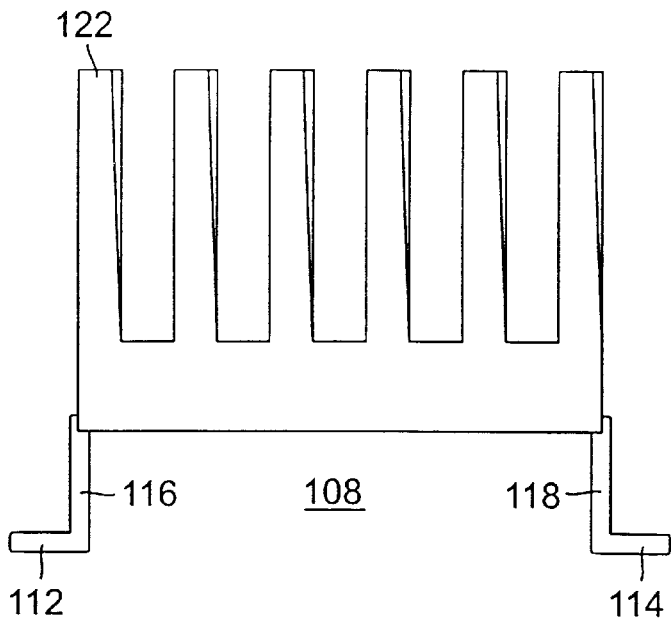
FIG. 2A is a diagrammatic side view of the surface mountable heat sink of FIG. 2.
Figure 2B:
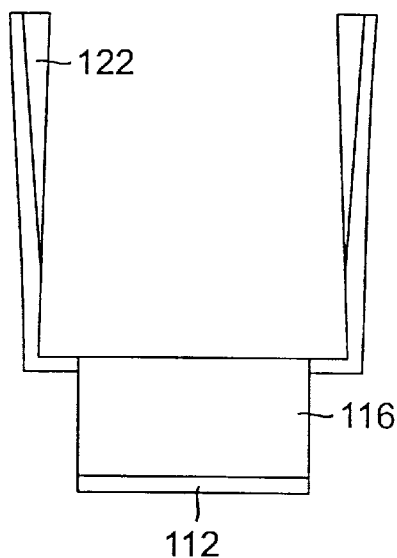
FIG. 2B is a diagrammatic side view of the surface mountable heat sink of FIG. 2 from a perspective oriented at an angle of 90° with respect to the perspective of FIG. 2A.
Figure 2C:
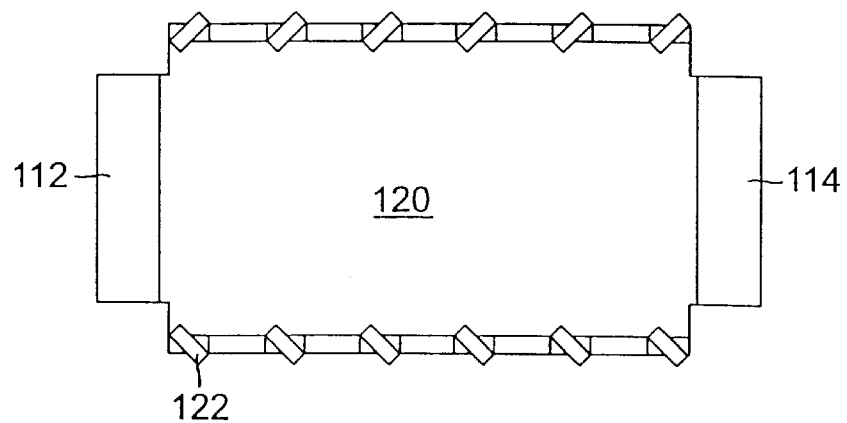
FIG. 2C is a diagrammatic top view of the surface mountable heat sink of FIG. 2.

Referring to FIGS. 2A–2C, heat sink 100 includes a pair of feet 112, 114 that respectively couple to heat pad 104. Feet 112, 114 are coupled to a pair of legs 116, 118, respectively, which extend away from the heat pad when the heat sink is soldered to the heat pad. Heat sink 100 also includes a pick-and-place surface 120 that is disposed between and coupled to each of the legs. As mentioned above, the two legs and the pick-and-place surface define sufficient space 108 so that the heat sink does not directly contact the heat generating component.

A plurality of heat-convecting fins 122 extend from legs 116, 118. The fins provide a thermal path from the legs to ambient atmosphere. The fins are twisted at an acute angle with respect to the legs to increase the effective heat-convecting surface area of the fins.

Referring back to FIG. 2, heat sink 100 is formed into a unitary structure from a single piece of thermally conductive material. The sheet is bent along two parallel lines 124, 126 to form legs 116, 118, respectively, and to form pick-and-place surface 120. The sheet is bent along parallel lines 128, 130 to form sides 132, 134. The top portions of sides 132, 134 are cut and each cut portion is twisted to form heat-convecting fins 122. The bottom portions of legs 116, 118 are respectively bent at an angle of 90° to form feet 112, 114, respectively.

In a presently preferred embodiment, designed for SOIC10 components, the feet are 0.3 inch long and 0.1 inch wide. The legs are 0.3 inch wide and 0.18 inch high. The distance between the inside surfaces 116, 118 of the legs is 0.39 inch. The distance between the outside surfaces of sides 132, 134 is 0.44 inch. The fins begin at 0.1 inch above the pick-and-place surface and extend 0.36 inch. The spacing between the fins is 0.035 inch. The copper stock is 0.02 inch thick.

In a presently preferred embodiment, designed for SOIC20 components, the feet are 0.3 inch long and 0.1 inch wide. The legs are 0.3 inch wide and 0.18 inch high. The distance between the inside surfaces of the legs is 0.65 inch. The distance between the outside surfaces of sides 132, 134 is 0.44 inch. The fins begin at 0.1 inch above the pick-and-place surface and extend 0.36 inch. The spacing between the fins is 0.066 inch. The copper stock is 0.02 inch thick.

The heat sinks of each of the above embodiments can be manufactured using a progressive stamping die in a discrete, individual format or in a continuous strip format which can be rolled up onto a reel. In a presently preferred embodiment, the heat sinks are formed from copper stock that has been tinned for solderability with 63/37 tin/lead, either before or after forming. This allows the heat sink to be attached to the heat pad in the same manner as electronic components in many SMT processes. The heat sinks can be plated by conventional techniques, e.g., by electrodeless tin plating in continuous strip format or by barrel plating in discrete format; the heat sink may also be manufactured from pre-tinned copper stock. The continuous strip format can be readily placed in tape-and-reel package format for delivery to automatic pick-and-place equipment, and can be easily integrated into an automated SMT line that uses such pick-and-place equipment.

Other embodiments are within the scope of the claims.

What is claimed is:

1. A surface mountable heat sink for convecting heat from a heat-generating component, the heat-generating component being thermally coupled to a thermally conductive heat pad, the heat sink comprising:

a pair of thermally conductive legs that respectively couple to the heat pad and respectively extend away from the heat pad when the heat sink is coupled thereto;

a pick-and-place surface coupled between the pair of legs, the pair of legs and the pick-and-place surface defining sufficient space to receive the heat-generating component so that the heat sink does not directly contact the heat-generating component when the heat sink is coupled to the heat pad;

a pair of feet with each of the feet coupled to a respective one of the legs and oriented at an angle with respect thereto for coupling the heat sink to the thermally conductive pad; and a plurality of heat-convecting fins that are each thermally coupled to the legs for providing a thermal path from the legs to ambient atmosphere, wherein the legs are substantially parallel and each of the fins is oriented at an acute angle with respect to the legs.

2. A method for making a heat sink comprising the steps of:

providing a sheet of thermally conductive material;

bending the sheet along two parallel lines to form first, second, and third sides of the heat sink with the second side being adjacent to both the first and third sides;

forming a plurality of fins from the first and third sides of the heat sink; and bending a portion of the second side at an angle with respect to the second side to form a cantilevered surface.

3. The method of claim 2 further comprising the step of forming one or more fins from the second side of the heat sink.

4. The method of claim 2 further comprising the step of bending portions of the first and third sides to form feet for coupling to the thermally conductive pad to which a heat generating component is coupled.

* * * * *

UNITED STATES PATENT AND TRADEMARK OFFICE
CERTIFICATE OF CORRECTION

PATENT NO. : 6,053,240
DATED : April 25, 2000
INVENTOR(S) : Craig N. Johnston et al.

It is certified that error appears in the above-identified patent and that said Letters Patent is hereby corrected as shown below:

<u>Title page,</u>
Item [73], delete "Assignee: Aavid Thermal Technologies, Inc., Concord, N.H."

Signed and Sealed this

Fifth Day of November, 2002

*Attest:*

*Attesting Officer*

JAMES E. ROGAN
*Director of the United States Patent and Trademark Office*